US008865595B2

(12) United States Patent
 Chang

(10) Patent No.: US 8,865,595 B2
(45) Date of Patent: Oct. 21, 2014

(54) DEVICE AND METHODS FOR FORMING PARTIALLY SELF-ALIGNED TRENCHES

(75) Inventor: Ya Hui Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 323 days.

(21) Appl. No.: 13/343,771

(22) Filed: Jan. 5, 2012

(65) Prior Publication Data
 US 2013/0175629 A1   Jul. 11, 2013

(51) Int. Cl.
 *H01L 21/44* (2006.01)

(52) U.S. Cl.
 USPC ........... 438/675; 438/424; 438/427; 438/430; 438/435; 438/587; 438/674; 438/737; 438/738

(58) Field of Classification Search
 USPC ......... 438/424, 427, 430, 435, 587, 674, 675, 438/737, 738
 See application file for complete search history.

(56) References Cited

U.S. PATENT DOCUMENTS

| 8,187,941 | B2 * | 5/2012 | Nakazawa et al. | 438/270 |
|---|---|---|---|---|
| 2002/0074585 | A1 * | 6/2002 | Tsang et al. | 257/302 |
| 2007/0224759 | A1 * | 9/2007 | Olligs | 438/257 |
| 2007/0243680 | A1 * | 10/2007 | Harari et al. | 438/257 |
| 2010/0133609 | A1 * | 6/2010 | Gilgen et al. | 257/330 |
| 2011/0037120 | A1 * | 2/2011 | Chen et al. | 257/331 |
| 2011/0115047 | A1 * | 5/2011 | Hebert et al. | 257/508 |
| 2012/0156855 | A1 * | 6/2012 | Sim | 438/421 |
| 2013/0065371 | A1 * | 3/2013 | Wei et al. | 438/294 |
| 2013/0137257 | A1 * | 5/2013 | Wei et al. | 438/586 |
| 2013/0140639 | A1 * | 6/2013 | Shieh et al. | 257/368 |
| 2013/0157450 | A1 * | 6/2013 | Fitz et al. | 438/586 |

OTHER PUBLICATIONS

Unpublished U.S. Appl. No. 13/460,971, filed May 1, 2012, entitled "Methods for Forming Trenches," 21 pages.
Unpublished U.S. Appl. No. 13/343,818, filed Jan. 5, 2012, entitled "Device and Methods for Small Trench Patterning," 18 pages.

* cited by examiner

*Primary Examiner* — Bac Au
(74) *Attorney, Agent, or Firm* — Haynes and Boone, LLP

(57) ABSTRACT

A semiconductor device and methods for small trench patterning are disclosed. The device includes a plurality of gate structures and sidewall spacers, an etch stop layer disposed over the sidewall spacers, an interlayer dielectric (ILD) layer disposed on a bottom portion of the etch stop layer, an etch buffer layer disposed on an upper portion of the etch stop layer, and a plurality of metal plugs between the gate structures. An upper portion of the metal plugs is adjacent to the etch buffer layer and a lower portion of the metal plugs is adjacent to the ILD layer.

20 Claims, 4 Drawing Sheets

DEVICE AND METHODS FOR FORMING PARTIALLY SELF-ALIGNED TRENCHES

BACKGROUND

As the integrated circuit (IC) fabrication moves to advanced technology nodes, the IC feature size scales down to smaller dimensions. For example, trench dimensions and gate sizes continue to get smaller and smaller. One limitation to achieving smaller sizes of IC device features is conventional lithography. Small trench formation typically requires a high cost exposure tool, such as extreme ultraviolet (EUV) lithography tools that are constrained by scanner wavelength and various patterns for blocking certain wavelengths. A large etching bias is generally required to compensate for the large lithographic pattern for non-shrinkable critical dimensions, which often results in poor critical dimension uniformity or shorting of the gate when blocking patterns are misaligned. Thus, better methods and materials are needed to define small trench dimensions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
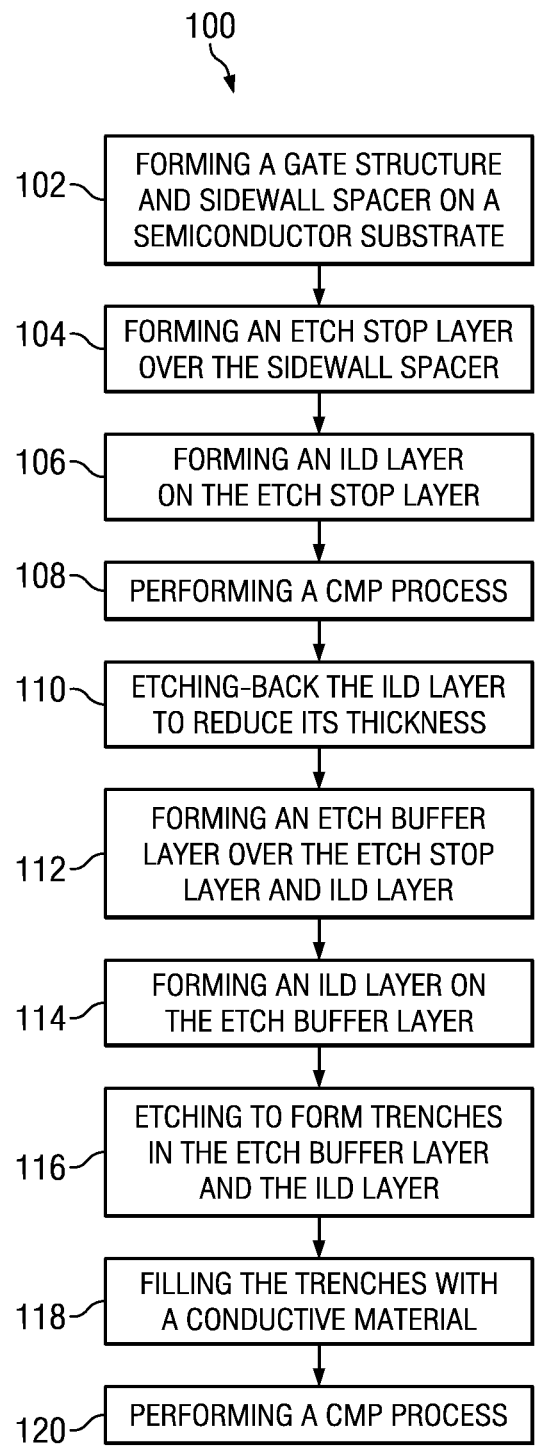
FIG. 1 is a flowchart of a method of making a semiconductor device constructed according to various aspects of the present disclosure in one or more embodiments.

One of the broader forms of the present disclosure involves a semiconductor device with an extra film. An exemplary semiconductor device includes a semiconductor substrate including a plurality of gate structures and sidewall spacers, an etch stop layer disposed over the sidewall spacers, an interlayer dielectric (ILD) layer disposed on a bottom portion of the etch stop layer, an etch buffer layer disposed on an upper portion of the etch stop layer, and a plurality of partially self-aligned metal plugs between the gate structures. The upper portion of the metal plugs is adjacent to the etch buffer layer, while the lower portion of the metal plugs is adjacent to the ILD layer.

Another one of the broader forms of the present disclosure involves a method of making a semiconductor device. The method includes forming a gate structure over a semiconductor substrate, forming a sidewall spacer adjoining a sidewall of the gate structure, forming an etch stop layer over the sidewall spacer, forming a first ILD layer over the etch stop layer, planarizing the first ILD layer, forming an etch buffer layer over the planarized first ILD layer, forming a second ILD layer over the etch buffer layer, forming trenches in the second ILD layer and the etch buffer layer, filling the trenches with a conductive material, and planarizing the conductive material.

In another embodiment, the method includes forming a gate structure over a semiconductor substrate, forming a sidewall spacer adjoining a sidewall of the gate structure, forming an etch stop layer over the sidewall spacer, forming a first silicon oxide layer over the etch stop layer, planarizing the first silicon oxide layer; forming a silicon nitride layer over the planarized first silicon oxide layer by plasma-enhanced chemical vapor deposition, physical vapor deposition, chemical vapor deposition, or a combination thereof, forming a second silicon oxide layer over the silicon nitride layer, forming trenches in the second silicon oxide layer and the silicon nitride layer, filling the trenches with a conductive material, and planarizing the conductive material.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of an embodiment of a method 100 for making a semiconductor device constructed according to various aspects of the present disclosure in one or more embodiments. FIGS. 2 through 8 are sectional views of a semiconductor device 200 at various fabrication stages and constructed according to one or more embodiments. The semiconductor device 200 and the method 100 of making the same are collectively described with reference to FIGS. 1 through 8.

The method 100 begins at step 102 by forming a gate structure and a sidewall spacer on a semiconductor substrate 210. In the present embodiment, the substrate 210 includes silicon. Alternatively, the substrate may include germanium, silicon germanium or other appropriate semiconductor materials. Also alternatively, the semiconductor substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and materials.

The substrate 210 may also include various doped regions such as p-wells and n-wells (not shown), formed by implantation techniques. As an example, a portion of the substrate 210 is doped p-type and formed a p-well where an n-channel device will be fabricated. Similarly, another portion of the substrate 210 is doped n-type and formed an n-well where a p-channel device will be fabricated. The doped regions are doped with p-type dopants, such as boron or difluoroborane ($BF_2$), and/or n-type dopants, such as phosphorus or arsenic. The doped regions may be formed directly on the substrate 210, in a p-well structure, in an n-well structure, in a dual-well structure, or using a raised structure.

The substrate 210 may further include source and drain (S/D) regions (not shown) formed by a proper technique, such as one or more ion implantations. The S/D regions may further include light doped source/drain (LDD) regions substantially aligned with the gate structure 220 and heavily doped S/D regions (not shown) substantially aligned with associated gate sidewall spacers 230, which are described below.

Typically, after the formation of the S/D regions, one or more annealing processes are performed to activate the S/D regions. The annealing processes include rapid thermal annealing (RTA), laser annealing processes, or other suitable annealing processes. As an example, a high-temperature thermal annealing step may apply temperatures anywhere in the range of 900° C.-1100° C., though other embodiments may use temperatures within a different range. Alternatively, high-temperature annealing may include thermal processes with temperatures above 600° C. This embodiment may further include a "spike" annealing process that has a very short time duration.

Figure 2:
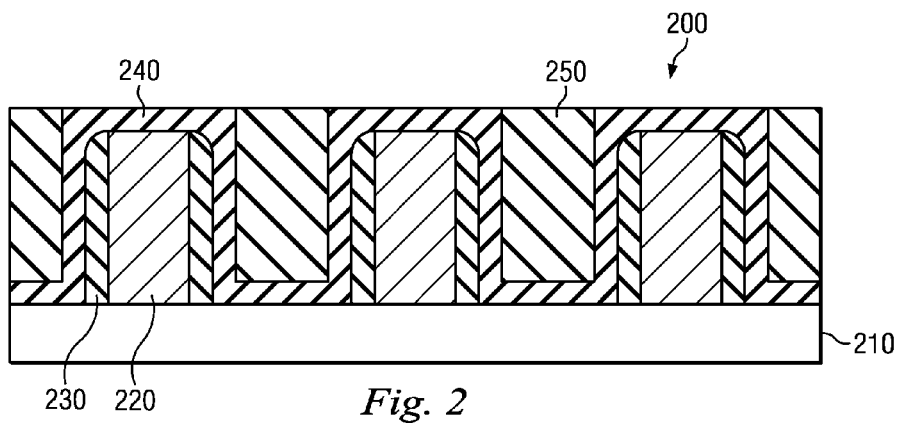
FIGS. 2-8 are sectional views of one embodiment of a semiconductor device at various fabrication stages constructed according to various aspects of the present disclosure in one or more embodiments.

Continuing with FIG. 2, the substrate 210 also includes a gate structure 220 formed by deposition, pattern and etch techniques. The gate structure 220 may include a dummy gate structure. A dummy gate structure refers to a gate structure which will be replaced with a metal gate in subsequent processes. The dummy gate structure may includes a dummy gate layer, such as polysilicon, amorphous silicon or other appropriate materials. The dummy gate layer is deposited over the substrate 210 by deposition techniques. For example, silane ($SiH_4$), di-silane ($Si_2H_6$), or di-chlorosilane ($SiCl_2H_4$) may be used as a chemical gas in a chemical vapor deposition (CVD) process to form a polysilicon layer. Alternatively and additionally, a dummy oxide layer (not shown), such as silicon dioxide ($SiO_2$) or silicon oxynitride (SiON), is disposed over the substrate 210 by thermal oxidation, chemical oxidation, CVD, atomic layer deposition (ALD) or any appropriate method. Thereafter, the dummy gate layer is disposed over the dummy oxide layer. In the depicted embodiment, the gate structure 220 includes a polysilicon dummy gate formed by deposition, patterning and etching processes, in a conventional manner.

Still referring to FIG. 2, gate sidewall spacers 230 are formed on the sidewalls of the gate structure 220. The gate sidewall spacers 230 generally include a dielectric material such as silicon nitride ($Si_3N_4$). Alternatively, the gate sidewall spacers 230 may include silicon oxide, $SiO_2$, SiC, SiON, or combinations thereof. Typical formation methods for the gate spacers 230 include depositing a dielectric material over the gate structure 220 and then anisotropically etching back the dielectric material. In the depicted embodiment, the gate sidewall spacers 230 include $Si_3N_4$ formed by CVD deposition and an anisotropic etching as known in the art.

At step 104, an etch stop layer 240 is formed over the sidewall spacer 230. The etch stop layer 240 may include silicon nitrides ($Si_xN_y$) such as $Si_3N_4$, silicon oxide, SiON, silicon oxycarbide (SiOC), silicon nitrocarbon (SiNC), metal oxides, and/or other suitable materials. In the depicted embodiment, the etch stop layer 240 includes $Si_3N_4$. Known processes are used to deposit the etch stop layer 240 over the sidewall spacers 230. The etch stop layer 240 acts to stop or slow down a future etch process. When etching reaches the etch stop layer 240, etching is minimal.

In step 106, a first ILD layer 250 is formed on the etch stop layer 240. The first ILD layer 250 may be formed by CVD, high density plasma CVD, spin-on methods, sputtering, and/or other suitable methods. The first ILD layer 250 typically includes an oxide such as silicon oxide, silicon dioxide, SiON, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In the present embodiment, the first ILD layer 250 is selected to have a high etch rate compared with the etch buffer layer 260 (described below). In the depicted embodiment, the first ILD layer 250 includes silicon oxide formed by a CVD technique.

In step 108, a chemical mechanical polishing (CMP) process is performed subsequently to remove excess first ILD layer 250. The CMP process provides a substantially planar surface for the gate structure 220 and the first ILD layer 250.

In one embodiment, a gate last (or replacement gate) process is performed. In the gate last (or replacement gate) scheme, a dummy (sacrificial) poly gate structure is initially formed and followed by a normal complementary metal oxide semiconductor (CMOS) process flow until deposition of an ILD. The dummy poly gate structure may then be removed and replaced with a metal gate structure. Thus, the gate is formed after high temperature processes have been applied in formations, such as source and drain regions. The gate last (or replacement gate) process scheme avoids the problems of work function material stability due to high temperature processes.

In a replacement gate (RPG) process flow, a typical gate structure formation includes forming an interfacial layer (IL), a high-k (HK) dielectric layer, capping layers, work function metal layers, barrier layers and an electrode metal layer on the gate trench. A CMP process may be performed to remove excess metal layers. The CMP process may have a high selectivity of metal layers to dielectric layer. The CMP process provides a substantially planar surface for the metal gate stacks and the first ILD layer 250 (described below).

Figure 3:
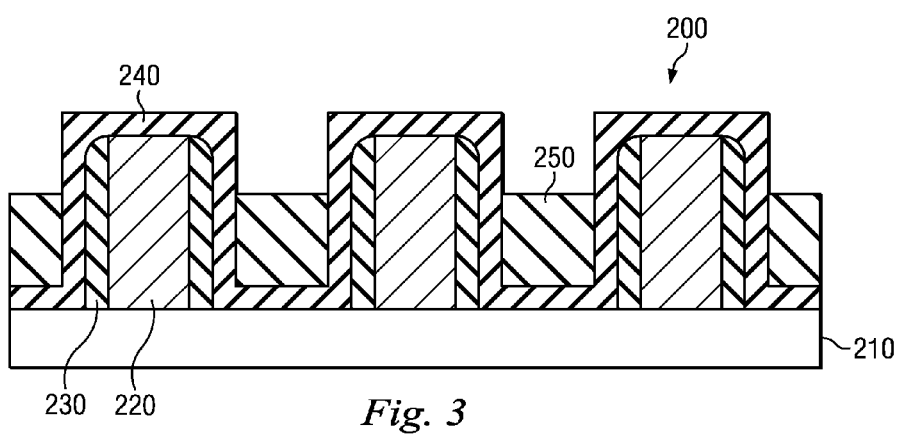

Continuing to FIG. 3, in step 110, the first ILD layer 250 is etched back to exposed an upper portion of the etch stop layer 240. The first ILD layer 250 is removed by an etch technique such as plasma etching, dry etch, wet etch, or combinations thereof.

Figure 4:
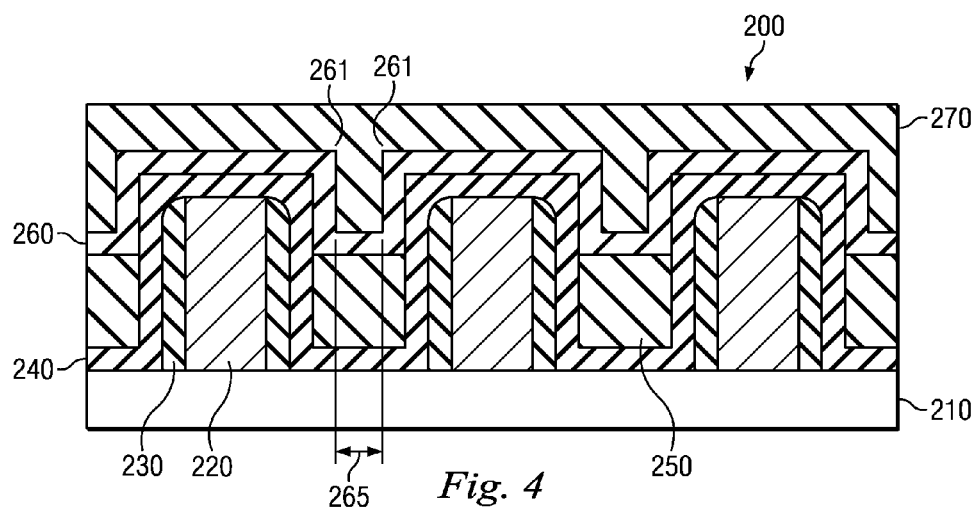

Referring now to FIG. 4, in step 112, an etch buffer layer 260 is formed over the etch stop layer 240 and the first ILD layer 250. The etch buffer layer 260 may be selected to include a material with high etching resistance that is not intended to be etched or removed, or to be etched at a rate much slower than the first ILD layer 250. In an exemplary embodiment, the etch buffer layer 260 has a slower etch rate than the first ILD layer 250. In the depicted embodiment in FIG. 4, the etch buffer layer 260 conforms to the shape of the upper portion of the etch stop layer 240.

In FIG. 4, the etch buffer layer 260 includes edges 261 that define a width or space 265 therebetween. The space 265 between adjacent edges 261 is narrower than the space between adjacent sidewall spacers 230. The adjacent edges 261 provide a partial self alignment of trench patterns for future trench formation.

The etch buffer layer 260 may include may include silicon nitrides ($Si_xN_y$) such as $Si_3N_4$, silicon oxide, SiON, SiOC, SiNC, metal oxides, and/or other suitable materials. The etch buffer layer 260 may be formed by ALD, CVD, plasma-enhanced chemical vapor deposition (PECVD), physical vapor deposition (PVD), and/or other deposition processes known in the art.

Still referring to FIG. 4, in step 114, a second ILD layer 270 is deposited over the etch buffer layer 260. The second ILD layer 270 may be formed of the same material as the first ILD layer 250, or may be a different material.

Figure 5:
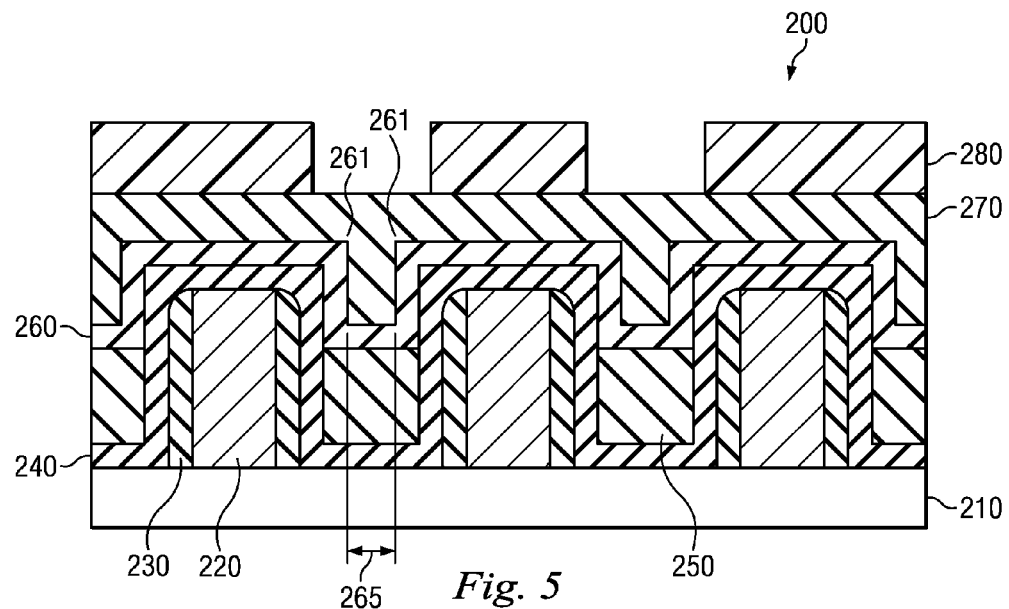
Figure 6:
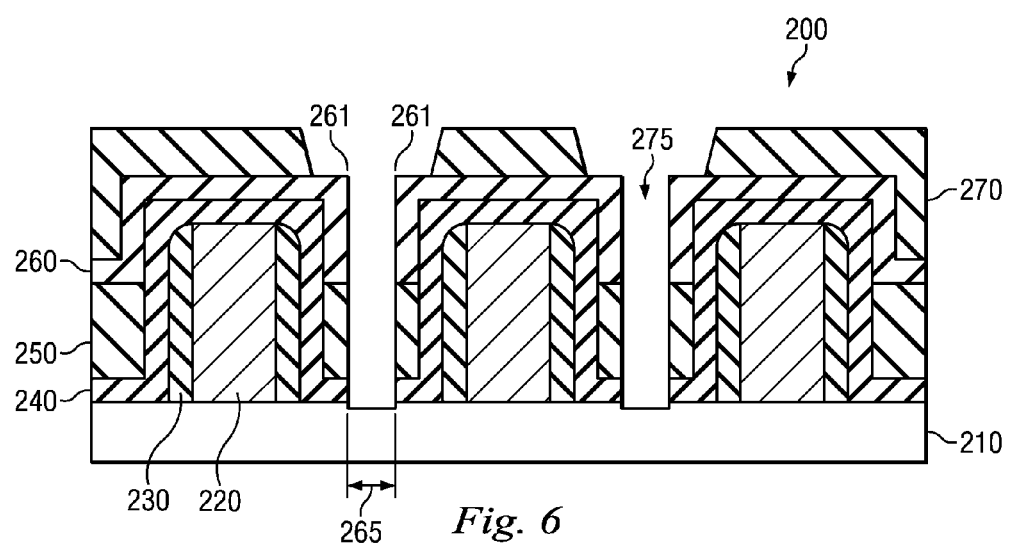

In FIG. 5, after the etch buffer layer 260 is formed, a hard mask layer and patterned photoresist layer (collectively shown as 280) are used to form trenches. For example, a hard mask layer, such as titanium nitride, is formed and is further patterned to form various openings using a lithography process. Alternatively, the hard mask layer is formed from silicon nitrides ($Si_xN_y$) such as $Si_3N_4$, SiON, SiOC, SiCN, metal oxides, and/or other suitable materials. The openings of the photoresist layer define regions for trenches.

A patterned photoresist layer (or patterned resist layer) is formed on the hard mask layer. The patterned resist layer includes various openings that define portions for trenches and expose those portions to subsequent etch. In one embodiment, the patterned resist layer is formed by a procedure including coating, exposure, post exposure baking, and developing. Particularly, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the resist layer is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. Thus the resist layer is patterned to have one or more openings as illustrated in FIG. 5. The lithography processes described above may only present a subset of processing steps associated with a lithography patterning technique. The lithography process may further include other steps such as cleaning and baking in a proper sequence. For example, the developed resist layer may be further baked, which is referred to as hard baking. Continuing to FIG. 6, in step 116, the etch buffer layer 260, first ILD layer 250, and second ILD layer 270 are etched to form trenches 275 in the first ILD layer 250, second ILD layer 270, and etch buffer layer 260. The etch buffer layer 260 slows down or stops lateral etching, and provides a partially self-aligned trench etching. In the depicted embodiments, the trenches are partially self-aligned to the edges 261 of the etch buffer layer. In other words, the trenches 275 are partially forced into a specific position. In this case, the trenches 275 are partially forced into a position that is between the edges 261 because the etch buffer layer 260 is etched at a rate is lower than the first ILD layer 250.

By providing materials with different etch rate, highly selective etching may be achieved to form trenches with smaller CD. The CD of the trenches is determined by the narrow space 265 between adjacent edges of the etch buffer layer 261, rather than the space between adjacent etch stop layers 240. The trenches are partially self aligned along the edges 261 to ensure that there is sufficient space between gate structures 220. The etching process is applied to etch the etch buffer layer 260 and the first ILD layer 250 to expose portions of the substrate 210. The different layers are removed by an etch technique such as plasma etching, dry etch, wet etch, or combinations thereof.

In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the trenches. Other dry-etch process may be alternatively used. The mechanism of etching in each dry-etch process may have a physical basis (e.g. glow-discharge sputtering, or ion milling) or a chemical basis (e.g., in pure plasma etching) or a combination of the both (e.g., reactive ion etching or RIE). Sputtering relies on directional nature of the incident energetic ions to etch in a highly anisotropic manner.

In one embodiment, plasma etching is used to form the trenches. To ensure selective and anisotropic etching, certain process parameters, such as the main gas and pressure are controlled in a conventional manner. Specifically, fluorine containing gases ($C_xFy$), such as $CF_4$, $CHF_3$, and $CH_2F_2$ may be used, as well as oxygen, argon, or combinations thereof. A low pressure is also used in the process. After etching, the hard mask and photoresist layers 280 may be removed by a process such as wet stripping or O2 plasma ashing.

Figure 7:
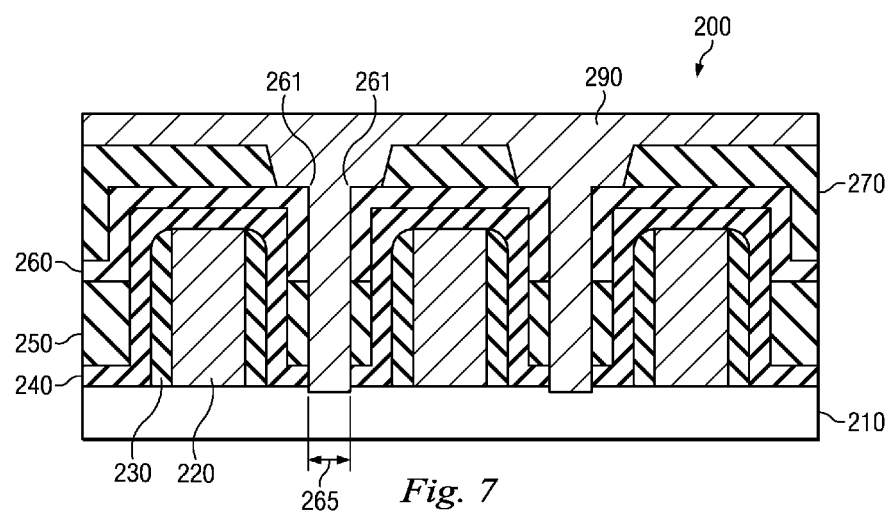
Figure 8:
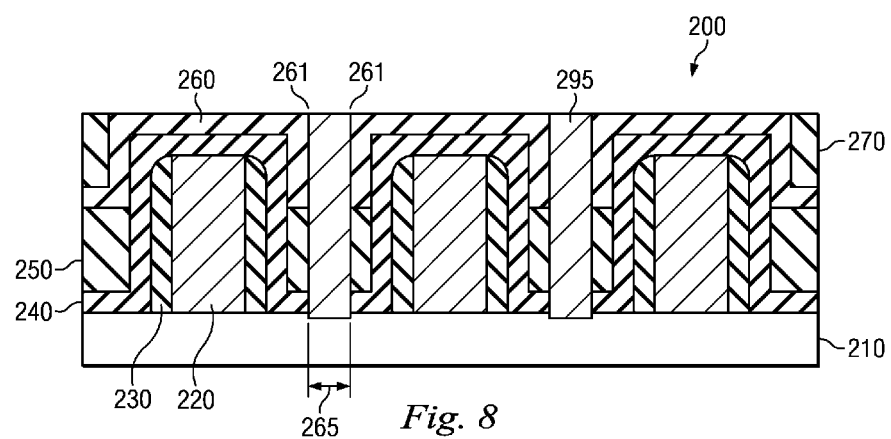

Referring to FIG. 7, the method 100 proceeds to step 118 by filling the trenches with a conductive material 290, such as one or more metals, resulting in contact features or metal plugs 295 (shown in FIG. 8). The conductive material 290 substantially fills in the trenches 275 and additionally deposits on the first ILD layer 250 and the second ILD layer 270. In one embodiment, tungsten is used to fill in the trenches 275 to form tungsten plugs. Other metals, such as copper or aluminum, may be used to form metal plugs 295. The metal deposition can use CVD, PVD, plating or a combination thereof.

Referring now to FIG. 8, the method continues to step 120 where another CMP process is performed to remove excessive conductive material formed on the second ILD layer 270 and to further planarize the top surface of the second ILD layer 270. Accordingly, after the CMP process, the excessive conductive material (e.g., tungsten) on the second ILD layer 270 is substantially removed without significant tungsten residue.

As can be seen in FIG. 8, the etch buffer layer 260 does not extend all the way down the length of the metal plug 295, but is only adjacent the upper portion of the metal plug 295. The first ILD layer 250 also does not extend the whole length of the metal plug 295, but is only adjacent the lower portion of the metal plug 295. Metal plug 295 is effectively isolated by at least two layers or walls. The first layer is the layer formed by the etch buffer layer 260 and the first ILD layer 250. The second layer is the etch stop layer 240.

As can be seen, with a selective etching process, the edges 261 may act as a barrier to prevent or significantly slow down lateral etching. With a selective and anisotropic etching process, the edges 261 may make trenches that are self-aligned between adjacent edges 261. The partial self-alignment of the trenches ensures that adequate space exists between gate structures 220 to prevent electric shorts. When a misalignment of trench patterning occurs, the edges 261 and a selective etching process may prevent the misalignment from transferring to the formation of the trenches, which may result in electric shorts. Instead, the edges 261 may keep trenches at a proper distance from the gate structure 220. In another words, if there is misalignment of the patterns during photo patterning, etching does not result in shorts in the semiconductor device 200.

With the use of the method 100 and structure 200, a CD limit of a lithography tool can be relaxed and an overlay control window can be wider. A small CD trench and improved overlap accuracy is achieved simultaneously in one simple method. A small CD trench can be achieved with a lithography tool with a larger CD limitation. Existing lithography tools can be used to meet the limits of new technology applications. This results in more efficient processes, smaller etch bias, more manufacturing flexibility, and lower costs. Advantageously, trenches having a CD smaller than what is possible in conventional lithographic techniques may be formed.

Other process steps may be implemented before, during and/or after the method 100. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:
    forming a gate structure over a semiconductor substrate;
    forming a sidewall spacer adjoining a sidewall of the gate structure;
    forming an etch stop layer over the sidewall spacer;
    forming a first interlayer dielectric (ILD) layer over the etch stop layer;
    planarizing the first ILD layer;
    forming an etch buffer layer over the planarized first ILD layer;
    forming a second ILD layer over the etch buffer layer;
    forming trenches in the second ILD layer and the etch buffer layer;
    filling the trenches with a conductive material; and
    planarizing the conductive material.

2. The method of claim 1, wherein the etch buffer layer comprises silicon nitride, the ILD layer comprises silicon oxide, or both.

3. The method of claim 1, further comprising replacing the gate structure with a metal gate after planarizing the first ILD layer.

4. The method of claim 1, wherein the etch buffer layer has an etch rate that is lower than the first ILD layer.

5. The method of claim 1, further comprising etching-back the first ILD layer to reduce thickness of the first ILD layer before forming the etch buffer layer.

6. The method of claim 1, wherein the etch buffer layer comprises an edge disposed on an upper portion of the etch stop layer, and wherein a width between adjacent edges is narrower than a width between adjacent sidewall spacers.

7. The method of claim 6, wherein the trenches are partially self-aligned along the adjacent edges.

8. The method of claim 6, wherein the etch buffer layer slows down lateral etching during formation of the trench.

9. The method of claim 6, wherein the etch buffer layer is formed by plasma-enhanced chemical vapor deposition, physical vapor deposition, chemical vapor deposition, or a combination thereof.

10. A method of making a semiconductor device, the method comprising:
    forming a gate structure over a semiconductor substrate;
    forming a sidewall spacer adjoining a sidewall of the gate structure;
    forming an etch stop layer over the sidewall spacer;
    forming a first silicon oxide layer over the etch stop layer;
    planarizing the first silicon oxide layer;
    forming a silicon nitride layer over the planarized first silicon oxide layer by plasma-enhanced chemical vapor deposition, physical vapor deposition, chemical vapor deposition, or a combination thereof;
    forming a second silicon oxide layer over the silicon nitride layer;
    forming trenches in the second silicon oxide layer and silicon nitride layer;
    filling the trenches with a conductive material; and
    planarizing the conductive material.

11. The method of claim 10, further comprising etching-back the first silicon oxide layer to reduce thickness of the first silicon oxide layer before forming the silicon nitride layer.

12. The method of claim 10, wherein adjacent edges of the silicon nitride layer define the critical dimension (CD) of the trenches, and the trenches have a smaller CD than the CD between the bases of adjacent gate structures.

13. The method of claim 10, wherein an upper portion of the trenches is adjacent to the silicon nitride layer and a bottom portion of the trenches is adjacent the first silicon oxide layer.

14. A method of making a semiconductor device, comprising:
    providing a semiconductor substrate;
    forming a plurality of gate structures over the semiconductor substrate;
    forming a plurality of sidewall spacers over the gate structures;
    disposing an etch stop layer over the sidewall spacers;
    disposing an interlayer dielectric (ILD) layer on a bottom portion of the etch stop layer;
    disposing an etch buffer layer on an upper portion of the etch stop layer; and
    forming a plurality of metal plugs between the gate structures, wherein an upper portion of the metal plugs is adjacent to the etch buffer layer and a lower portion of the metal plugs is adjacent to the ILD layer.

15. The method of claim 14, wherein the etch stop layer, the etch buffer layer, or both comprise silicon nitride.

16. The method of claim 14, wherein the etch buffer layer has an etch rate that is lower than the ILD layer.

17. The method of claim 14, wherein the metal plugs comprise tungsten.

18. The method of claim 14, wherein adjacent edges of the etch buffer layer define a critical dimension (CD) of the metal plugs.

19. The method of claim 18, wherein the metal plugs are partially self-aligned along the adjacent edges.

20. The method of claim 18, wherein a width between the adjacent edges is narrower than a width between bases of adjacent gate structures.

* * * * *